United States Patent [19]
Yu

[11] 3,879,631
[45] Apr. 22, 1975

[54] SEMICONDUCTOR TARGET WITH REGION ADJACENT PN JUNCTION REGION SHIELDED

[75] Inventor: Karl K. Yu, Monroeville, Pa.

[73] Assignee: Westinghouse Electric Corporation, Pittsburgh, Pa.

[22] Filed: July 19, 1974

[21] Appl. No.: 490,180

Related U.S. Application Data

[63] Continuation of Ser. No. 315,257, Dec. 14, 1972, abandoned.

[52] U.S. Cl. .................................. 313/366; 313/367
[51] Int. Cl. .......................... H01j 29/45; H01j 31/38
[58] Field of Search ......................... 313/367; 357/31

[56] References Cited

UNITED STATES PATENTS

| | | | |
|---|---|---|---|
| 2,886,739 | 5/1959 | Matthews et al. | 313/367 |
| 3,548,233 | 12/1970 | Cave et al. | 313/367 |
| 3,564,309 | 2/1971 | Hoeberechts et al. | 313/367 |

*Primary Examiner*—Robert Segal
*Attorney, Agent, or Firm*—W. G. Sutcliff

[57] ABSTRACT

A semiconductor device including a wafer of semiconductive material of one conductivity type and a region within said wafer of opposite type conductivity and a PN junction formed therebetween. A radiation shielding member is disposed about the region and extends above a portion of the surface of the wafer and over a portion of the region to shield at least a portion of the depletion region about the PN junction from radiation.

2 Claims, 12 Drawing Figures

SEMICONDUCTOR TARGET WITH REGION ADJACENT PN JUNCTION REGION SHIELDED

This is a continuation, of application Ser. No. 315,257 filed 14 Dec. 1972, and now abandoned.

BACKGROUND OF THE INVENTION

The invention herein described was made in the course of or under a contract with the Department of the Navy.

Solid state diodes are used in many applications wherein a high power device is desired and one particular embodiment is within an electron beam amplifier. In this type of structure, the basis of operation is utilization of energetic electrons about 10 Kev to create hole-electron pairs by ionization within the depletion region of a reverse biased diode. Current gains of 1,000 or more can be obtained from such devices. To obtain maximum power gain, it is desirable to have the widest depletion region possible within the penetration range of the ionizing electrons. Thus, it is also desirable to have the diode with as large a reverse breakdown voltage capability as possible. Although high breakdown voltage diodes can be manufactured with passivated planar junctions, they degrade under radiation bombardment of high energy electrons or other particles. The present understanding of the voltage degradation phenomena is that the semiconductor surface damage resulting from the radiation reduces the breakdown voltage capability of the diode. Several insulating and passivating type coatings have been tried over the diodes for radiation resistance with little success. Thick metal layers have also been provided over the junction periphery with similar results. Although the thick metal layer prevented the ionizing electrons from damaging the junction periphery and the area under the thick metal layer, the radiation surface damage still occurred immediately beyond the edge of the thick metal and causes degradation of the breakdown voltage.

SUMMARY OF THE INVENTION

This invention is directed to an improved high power semiconductor diode of the planar type. The diode is comprised of a wafer of a first type of conductivity having a central region disposed on one surface of the wafer of a second type of conductivity. The central region forms a PN junction with the wafer body and a depletion region is formed about the PN junction. The ohmic contact to the central region is provided by a metallic coating over the entire central surface region and extends over a portion of an insulating coating provided on the wafer body wherein an aperture within the insulating coating provides electrical contact to the central region. A radiation shield is disposed about the central region and spaced therefrom beyond the edge of the depletion region and may be in ohmic contact with the wafer via an annular opening in the insulating coating. The radiation shield electrode extends inwardly toward the central region so as to shield at least a portion of the ohmic contact metal of the central region, but electrically isolated from the latter, and in combination with the ohmic contact to the central region provides a heavy metallic intercepting medium means for radiations directed onto the surface edge of the depletion region.

BRIEF DESCRIPTION OF THE DRAWINGS

For a better understanding of the invention, reference may be had to the preferred embodiments, exemplary of the invention, shown in the accompanying drawings, in which.

DESCRIPTION OF THE PREFERRED EMBODIMENT

Figure 1:
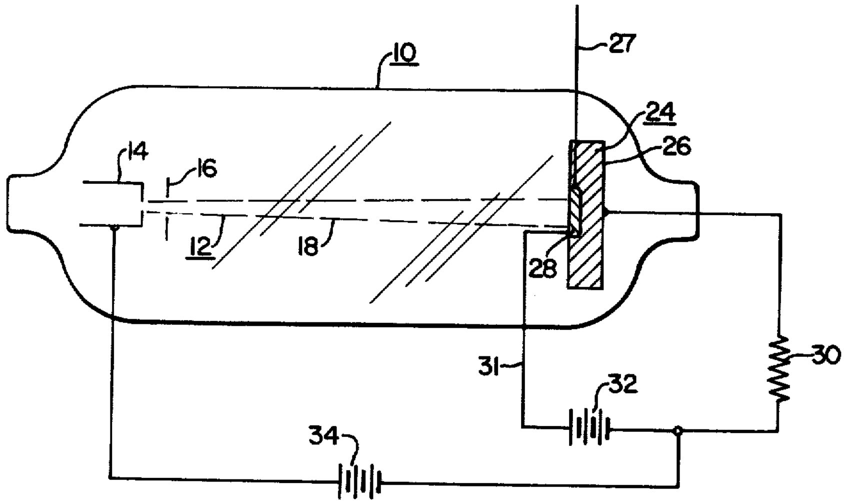
FIG. 1 is a schematic diagram of an electron tube incorporating a semiconductive target in accordance with the teachings of this invention.

Referring now to FIG. 1 there is illustrated a schematic showing of an embodiment of a semiconductor diode incorporated within an electron tube. The electron tube comprises an evacuated envelope 10 having an electron gun 12 provided at one end thereof. The electron gun 12 may include at least a cathode 14 and a control grid 16 for generating an electron beam which is directed onto a target 24. The control grid 16 may be connected to an input signal. The target electrode 24 is comprised of a semiconductor diode and includes a wafer 26 of N-type material and a central region 28 of P-type material. An electrical lead 29 is connected to an ohmic contact on the N-type wafer 26 and is connected through a load 30 to the positive terminal of a battery 32. A lead 31 is also connected to the P-type region 28 via an ohmic contact and is connected to the negative terminal of the battery 32. The battery 32 provides a reverse bias across the PN junction 27 formed within the target 24. A battery 34 is connected between the cathode 14 and the target 24 to provide necessary acceleration of the electrons in the beam 18.

Figure 2:
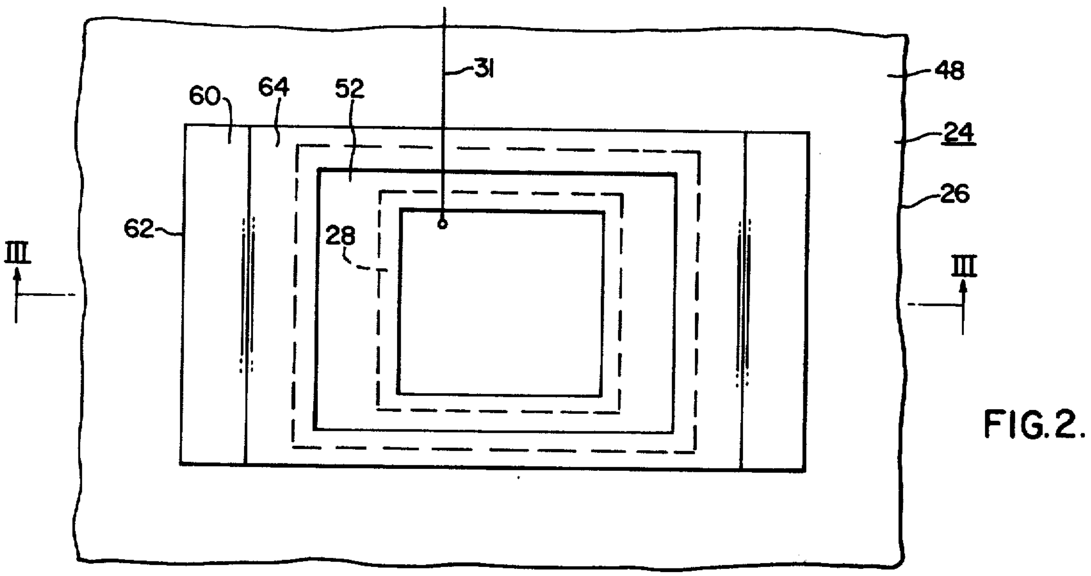
FIG. 2 is a front view of the semiconductor target shown in FIG. 1.
Figure 3:
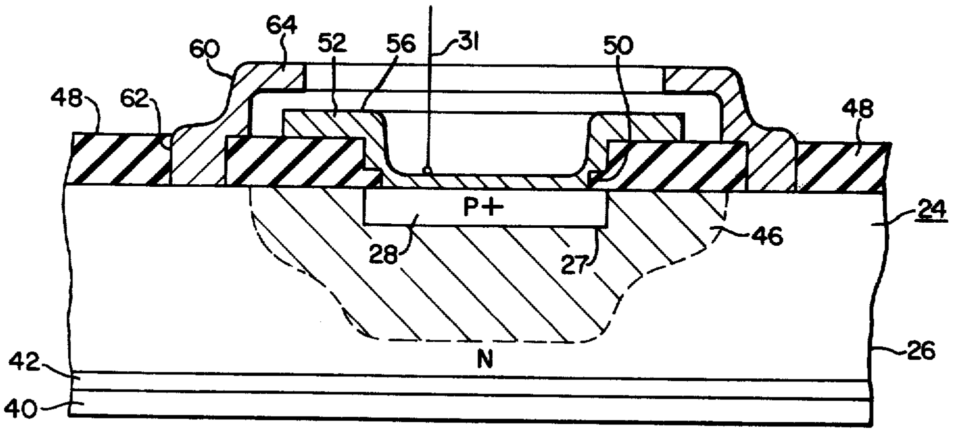
FIG. 3 is a sectional view taken along line III—III of FIG. 2.

The target 24 is shown in detail in FIGS. 2 and 3. The target 24 may be supported on a metal plate 40 of a suitable material such as molybdenum and n+ layer 42 is provided on the support side of the wafer 26. The wafer 26 may be of a N-type silicon wafer material having a resistivity of about 10 ohm-cm. The P-type central region 28 is provided on the input surface (facing the electron gun 12) of the target 24 and may be selectively diffused into the wafer 26 as illustrated in the drawing. The PN junction 27 is formed between the central region 28 and the wafer body 26. The depletion region 46 is also formed within the body of the wafer 26 about the PN junction 27.

An insulating coating 48 is provided on the upper surface or input surface of the target 24 of a suitable material such as silicon dioxide. An aperture 50 is provided in the insulating coating 48 over the region 28. An ohmic contact is made to the region 28 by the contact 52 which is of a suitable material such as aluminum which covers the entire surface of the P-type region 28 exposed through the aperture 50 in the insulating coating 48. The thickness of the contact 52 over the P-type region 28 may be about 1,000A. The contact 52 also extends up along the sides of the walls of the aperture 50 in the insulating coating 48 and also provides an upper peripheral ring portion 56 which is located on the upper surface of the insulating coating 48 surrounding the aperture 50. The thickness of the ring portion 56 may be about 30,000A. An electrical lead 31 is connected to the contact 52.

A shielding electrode 60 which is annular in shape and surrounds the contact 52 is provided on the upper surface of the wafer body 26. An annular groove 62 or opening is provided in the insulating coating 48 to accommodate the shielding electrode 60 which is in ohmic contact with the wafer body 26. The radiation shield 60 includes an inturned portion 64 which projects inwardly so as to extend over the peripheral ring portion 56 of the contact 52 and is insulated therefrom. The two electrodes 52 and 60 overlap to intercept electrons externally directed onto the input surface beyond the aperture 50 in the insulating coating 48.

Figure 4:
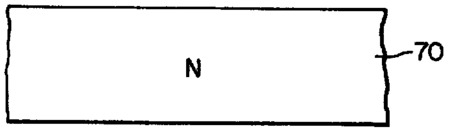
FIGS. 4 through 12 illustrate fragmentary sectional views of steps in the manufacture of the semiconductive target structure.
Figure 5:
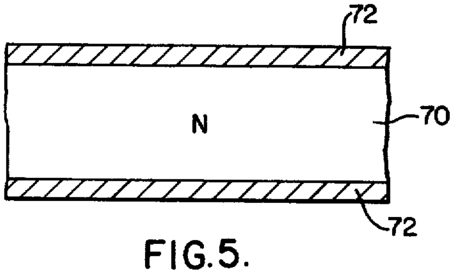
Figure 6:
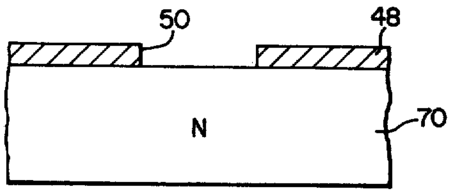
Figure 7:
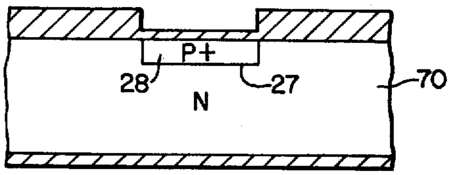
Figure 8:
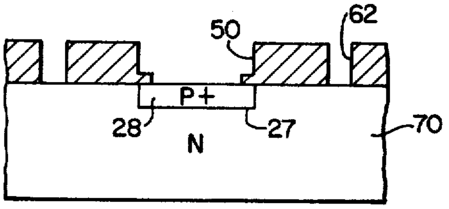
Figure 9:
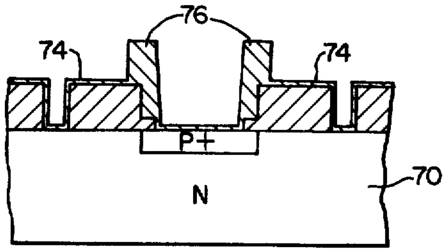

In one example of the invention, the diode was made from a silicon disc having a thickness of about 200 micrometers and a diameter of about 2,000 by 2,500 micrometers of a suitable material such as N-type silicon having a resistivity of about 10 ohm-cm. This starting portion is illustrated in FIG. 4. The usual practice is to fabricate a plurality of diodes within one wafer. The next step in the manufacture is to provide a silicon-dioxide coating 72 on both sides of the wafer 70 as illustrated in FIG. 5. These coatings 72 may be provided by thermal oxidation of the silicon at a temperature of about 1,100°C to an oxide thickness of about 6,000A. The next step in the fabrication is to provide a suitable photoresist coating on the upper surface of coating 72 and then expose through a suitable mask. The photoresist coating is then developed so as to provide a resist coating over the coating 72 having an aperture therein and then etching the oxide coatings 72 away to expose and provide an aperture 50 in the coating 72 as illustrated in FIG. 6. After this step in the manufacture the photoresist coating is removed and the junction 27 is formed within the wafer 70 by diffusing a suitable material such as boron through the aperture 50 in the insulating coating 48 to provide the central region 28. The next step in the fabrication is then to provide a second oxide coating over the coating 72 to provide the structure illustrated in FIG. 7. The next step in the operating is to again provide a photomask procedure and then etch out the exposed surfaces of oxide coating down to the wafer 70. The resulting structure is shown in FIG. 8 and includes the aperture 50 over the P-region 28 and also an annular groove 62. The next step is to provide a thin conductive coating 74 and a thick conductive coating 76 as illustrated in FIG. 9. There are many possible methods of fabricating the thick and thin metallization coatings 74 and 76 of a suitable material such as gold with a very thin (100A) layer of titanium underneath for adhesion. One method is to evaporate thin metal layers such as 1,000A of gold on top of 100A of titanium first and then provide a photoresist mask and then selectively electroplate a material such as gold onto the exposed region to form the thick metal regions 76.

Figure 10:
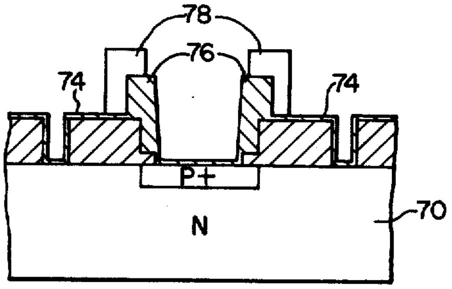

The next step in the fabrication is to provide a spacer member 78 as illustrated in FIG. 10. Here again, several methods are available for the formation of the spacer 78. In the example illustrated in FIG. 10, the spacer 78 is formed by selectively plating a suitable material such as nickel to the desired thickness of about 5 microns using a photoresist mask. Other metals may be used as spacers if they can be etched away without removing the diode contact metallization at the same time. An alternative method would involve coating an insulating material over the surface and then delineate it by using photoresist techniques to form the spacer 78. In these cases, the spacer 78 could remain in the final structure.

Figure 11:
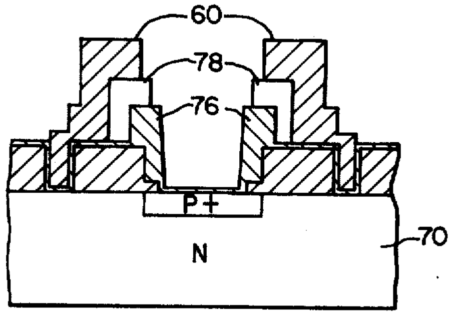

The next step in the fabrication is to form the radiation shield 60 as illustrated in FIG. 11. In the device illustrated in FIG. 11, the radiation shield 60 is formed by selectively plating a metal different than the spacer material such as gold to a thickness of about 3 microns using photoresist as a mask. Other metals can be used if they are resistant to the spacer removal etching process. It is also possible to deposit the radiation shield 60 by depositing polycrystalline silicon. The spacer and the other metallic materials must be able to withstand the polycrystalline silicon process temperature which is about 600°C or higher.

Figure 12:
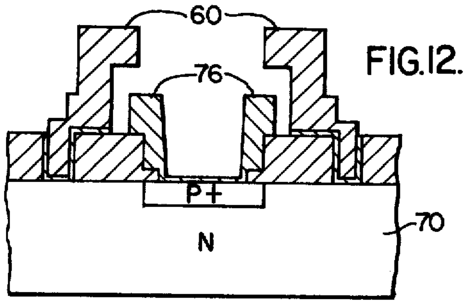

The next step in the fabrication is to remove the spacer 78 to provide the structure illustrated in FIG. 12. As previously indicated this may be accomplished by etching away the nickel or other material utilized in the spacer and the thin metal layer used for plating purposes. In the case of the alternative methods, these special etching processes may not be needed.

It can be seen that the overhang 64 provided by the radiation shield 60 is such so that no primary electrons can reach the insulator 48 and of course the semiconductor material that exists below the insulator 48. This will eliminate completely the surface damage and the breakdown voltage degradation resulting from radiation at the surface edge of the depletion region 46. The radiation shield 60 being in ohmic contact with the semiconductor requires no extra lead for its function. It also has the advantage of conducting away the absorbed energy of the interceptor beam from the active part of the diode thus eliminating part of the heating effects associated with this type of device. The radiation shield 60 also provides mechanical support and particularly in those cases where the semiconductor wafer may be thinned down to about 25 micrometers in thickness for optimum thermal conductance. It is of course obvious that modifications may be made to the above described invention without departing from the scope thereof. For example, the radiation shield may be provided in such a manner that it could be connected to a potential other than the wafer potential.

I claim as my invention:

1. A planar semiconductive diode target comprising, a body portion of a semiconductive material of a first type conductivity with a substantially planar surface, a central region of a second opposite type semiconductive material extending from the planar surface into the body portion a predetermined distance, with the first type semiconductive material selected from N-type and P-type semiconductive material and the second type being the other type, with a PN junction formed at the interface between the opposite type semiconductive materials, a depletion region formed at said PN junction and extending into the body portion about the PN junction, an insulating layer disposed upon the planar surface peripherally about the central region and overlapping the peripheral edge of the central region, a first contact electrode disposed upon the central region in ohmic contact with the central region material and overlapping a portion of the insulating layer, a second shielding electrode disposed in ohmic contact with and upon the planar surface of the body portion of the target about the insulating layer beyond the outer edge of the depletion region at the planar surface of the body portion, and which second shielding electrode extends from the planar surface and has an inwardly projecting extending end portion which is spaced above the insulating layer and the peripheral edge of the first contact electrode, said target being disposed within a cathode ray tube and having its PN junction side facing the cathode therein.

2. The target set forth in claim 1, wherein the second shielding electrode is in ohmic contact with the body portion beyond the outer edge of the depletion region at the planar surface of the body portion.

* * * * *